(12) United States Patent
Matsuo et al.

(10) Patent No.: US 6,306,556 B1
(45) Date of Patent: Oct. 23, 2001

(54) PATTERN FORMING MATERIAL AND PATTERN FORMING METHOD

(75) Inventors: Takahiro Matsuo, Kyoto; Masayuki Endo, Osaka; Masamitsu Shirai, Osaka; Masahiro Tsunooka, Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/551,656

(22) Filed: Apr. 18, 2000

Related U.S. Application Data

(62) Division of application No. 08/326,541, filed on Jun. 7, 1999, now Pat. No. 6,120,974, which is a division of application No. 08/805,702, filed on Feb. 25, 1997, now Pat. No. 5,965,325.

(30) Foreign Application Priority Data

Feb. 26, 1996 (JP) .................................................. 8-038100

(51) Int. Cl.$^7$ .................................................. G03C 1/725
(52) U.S. Cl. .................................... 430/287.1; 430/270.1; 430/195; 526/262; 526/287; 526/282
(58) Field of Search .................................. 526/262, 287, 526/282; 430/270.1, 287.1, 195

(56) References Cited

U.S. PATENT DOCUMENTS

| | | | | |
|---|---|---|---|---|
| 2,948,610 | * | 8/1960 | Merrill et al. | 430/195 |
| 3,558,311 | * | 1/1971 | Delezenne et al. | 96/36.3 |
| 3,918,973 | * | 11/1975 | Mertens | 96/48 R |
| 4,775,609 | | 10/1988 | McFarland | 430/330 |
| 4,869,995 | | 9/1989 | Shirai et al. | 430/270.1 |
| 5,015,559 | | 5/1991 | Ogawa | 430/326 |
| 5,238,777 | * | 8/1993 | Potts et al. | 430/195 |
| 5,278,023 | | 1/1994 | Shirai et al. | 430/323 |
| 5,650,261 | | 7/1997 | Winkle | 430/270.1 |
| 5,741,628 | * | 4/1998 | Matsuo et al. | 430/323 |

FOREIGN PATENT DOCUMENTS 0 515 212    11/1992  (EP) .
0 519 128    12/1992  (EP) .
0 691 674     1/1996  (EP) .

OTHER PUBLICATIONS

Tsunooka et al, *Journal of Polymer Science Polymer Chemistry Edition*, 1975 vol. 15, pp. 107–117, No month 1977.*
"Photosensitive Polymers Bearing Iminooxysulfonyl Groups. A Water Soluble Positive–Type Photoresist", by Shirai et al, Die Markomol. Chemie. Macromolecular Chemistry and Physics, vol. 90, No. 9, pp. 2099–2107 (1989).
Shirai et al, 114:63167, Chemical Abstracts, America Chemical Society, Columbus, Ohio, Abstract of J. Appl. Polym. Sci. (1990), vol. 41, No. 9–10, pp. 2527–2532.

* cited by examiner

Primary Examiner—Cynthia Hamilton
(74) Attorney, Agent, or Firm—McDermott, Will & Emery

(57) ABSTRACT

A pattern forming material includes a binary copolymer represented by the following general formula or a ternary or higher copolymer obtained by further polymerizing the binary copolymer with another group:

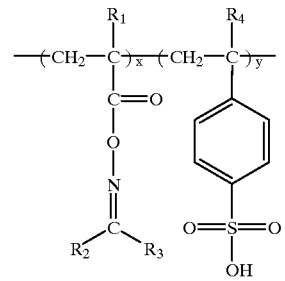

wherein $R_1$ indicates a hydrogen atom or an alkyl group; $R_2$ and $R_3$ independently indicate a hydrogen atom, an alkyl group, a phenyl group or an alkenyl group or together indicate a cyclic alkyl group, a cyclic alkenyl group, a cyclic alkyl group having a phenyl group or a cyclic alkenyl group having a phenyl group; $R_4$ indicates a hydrogen atom or an alkyl group; x satisfies a relationship of $0<x<1$; and y satisfies a relationship of $0<y<1$.

1 Claim, 5 Drawing Sheets

PATTERN FORMING MATERIAL AND PATTERN FORMING METHOD

This application is a Divisional of application Ser. No. 09/326,541, filed Jun. 7, 1999, now U.S. Pat No. 6,120,974, which is a Divisional of application Ser. No. 08/805,702, filed Feb. 25, 1997 and now U.S. Pat. No. 5,965,325.

BACKGROUND OF THE INVENTION

The present invention relates to a fine-line pattern forming method for use in a manufacturing process for a semiconductor IC device and the like, and a material for forming a pattern used in the pattern forming method.

In the manufacture of ICs, LSIs and the like, a pattern is conventionally formed through photolithography using UV, in which a light source with a shorter wavelength has become mainly used in accordance with refinement of a semiconductor device. Recently, a surface imaging process using dry development has been developed in order to increase the depth of focus and improve practical resolution in using a light source with a shorter wavelength.

As an example of the surface imaging process, U.S. Pat. No. 5,278,029 discloses a method in which, after selectively forming a polysiloxane film on the surface of a resist film of a resist material which can generate an acid through exposure, the resist film is dry etched by using the polysiloxane film as a mask, so as to form a resist pattern. Now, this conventional method of forming the resist pattern will be described with reference to FIGS. 5(a) through 5(d).

In this method, a copolymer of 1,2,3,4-tetrahydronaphthyridinenimino-p-styrene sulfonate (NISS) and methyl methacrylate (MMA) is used as the resist material for generating an acid through exposure.

First, as is shown in FIG. 5(a), a resist film 401, which generates an acid through. exposure, coated on a semiconductor substrate 400 is irradiated with a KrF excimer laser 404 by using a mask 403, and thus, the acid is generated in an exposed area 401a of the resist film 401. Owing to this acid, the exposed area 401a is changed to be hydrophilic, so that water in air can be easily adsorbed by the exposed area 401a. As a result, a thin water absorbing layer 405 is formed in the vicinity of the surface of the exposed area 401a as is shown in FIG. 5(b).

Next, when an alkoxysilane gas 406 is introduced onto the surface of the resist film 401, the acid generated on the surface of the exposed area 401a works as a catalyst, so that alkoxysilane is hydrolyzed and dehydrated. As a result, an oxide film 407 is formed on the surface of the exposed area 401a as is shown in FIG. 5(c). Subsequently, when the resist film 401 is dry etched by RIE using $O_2$ plasma 408 by using the oxide film 407 as a mask, a fine-line resist pattern 409 is formed as is shown in FIG. 5(d).

This pattern forming method thus adopts a negative type lithography process for forming a resist pattern in an exposed area, in which the acid generated in the exposed area of the resist film is used as the catalyst for selectively forming the oxide film in the exposed area and the oxide film is used as a mask in the dry etching for forming the resist pattern.

The negative type lithography process has the following problems in, for example, forming a contact hole for connecting multilayered interconnections of an IC:

First, usage of a mask generally adopted in pattern exposure can cause the following problem: In the lithography for forming a contact hole, the aperture ratio of the mask is very high when the negative lithography process is used. Specifically, while a light shielding film against exposing light is formed merely in a portion corresponding to the contact hole on the mask, the light shielding film is removed and quartz of the mask substrate is bare in the other portion excluding the contact hole in order to transmit the exposing light. Since the area occupied by all the contact holes in the entire area of a semiconductor chip is generally very small, the proportion of the area occupied by the bare quartz to the area of the light shielding film on the mask becomes high, namely, the aperture ratio of the mask becomes high.

When the aperture ratio of the mask is high, the effect of ambient dusts is increased. Specifically, dusts adhered to the light shielding film on the mask scarcely affect the process, but those adhered to the transparent portion of the mask change this portion into a light shielding portion. When the exposure is effected by using the mask to which dusts are thus adhered, a pattern defect is caused in the portion to which the dusts are adhered. In this manner, since the aperture ratio of the mask is high in the negative type lithography process, the process can be easily affected by dusts, resulting in easily decreasing the yield.

Secondly, in the lithography process for forming a contact hole, a half-tone type mask can be used for the purpose of increasing the depth of focus. However, the effect of increasing the depth of focus can be attained merely in a positive type lithography but cannot be attained in the negative type lithography. Accordingly, in the formation of a contact hole, the depth of focus is smaller in the negative type process than in the positive type process.

The occurrence of these first and second problems are not limited to the formation of a contact hole, but can be caused in the cases where a mask having a larger area of the transparent portion is used and where the depth of focus is desired to be increased.

SUMMARY OF THE INVENTION

In view of the aforementioned conventional problems, the object of the invention is realizing a positive type surface imaging process replaceable with the negative type surface imaging process.

In order to achieve this object, a resist film including an acidic or a basic group is selectively irradiated with an energy beam in this invention, so that a basic or an acidic group having the reverse property to that of the group included in the resist film can be generated in an exposed area. Alternatively, after generating an acidic or a basic group in an exposed area by selectively irradiating a resist film with an, energy beam, the entire surface of the resist film is irradiated with another energy beam, so that a basic or an acidic group having the reverse property to that of the group generated in the exposed area can be generated on the entire surface of the resist film. Thus, neutralization is effected in the exposed area of the resist film, and in an unexposed area of the resist film, the acidic or the basic group works as a catalyst for forming an oxide film. In this manner, a positive type surface imaging process, which cannot be attained by the conventional method, can be realized by this invention.

The first pattern forming material of this invention comprises a copolymer including a first group for generating a base through irradiation with an energy beam and a second group having an acidic property.

When the resist film formed out of the first pattern forming material is selectively irradiated with the energy beam, the first group is dissolved into the base in the exposed area on the resist film, so that the generated base is neutralized with the second group having the acidic property, while the unexposed area on the resist film remains to be acidic. Accordingly, since merely the unexposed area on the resist film can selectively retain its acidic property, the positive type surface imaging process can be realized.

The second group in the first pattern forming material is preferably a group including a sulfonic acid group. In this case, owing to the strong acidic property of sulfonic acid, sulfonic acid can exhibit its strong catalytic function in the formation of the metal oxide film in the unexposed area on the resist film. Therefore, the strong acidic property can be selectively retained merely in the unexposed area on the resist film.

The copolymer in the first pattern forming material is preferably a binary copolymer represented by the following general formula or a ternary or higher copolymer obtained by further polymerizing the binary copolymer with another group:

Chemical Formula 1:

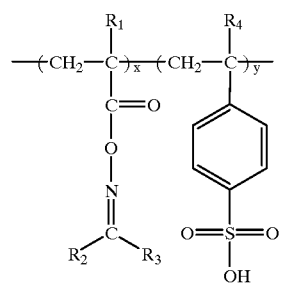

wherein $R_1$ indicates a hydrogen atom or an alkyl group; $R_2$ and $R_3$ independently indicate a hydrogen atom, an alkyl group, a phenyl group or an alkenyl group, or together indicate a cyclic alkyl group, a cyclic alkenyl group, a cyclic alkyl group having a phenyl group or a cyclic alkenyl group having a phenyl group; $R_4$ indicates a hydrogen atom or an alkyl group; x satisfies a relationship of $0<x<1$; and y satisfies a relationship of $0<y<1$.

In this case, since sulfonic acid can exhibit its strong catalytic function in the formation of the metal oxide film in the unexposed area on the resist film, the strong acidic property can be selectively retained in the unexposed area on the resist film. On the other hand, in the exposed area on the resist film, since amine having a strong basic property is generated, sulfonic acid having a strong acidic property can be completely neutralized. Accordingly, the strong acidic property can be selectively retained merely in the unexposed area on the resist film.

The second pattern forming material of this invention comprises a copolymer including a first group for generating an acid through irradiation with an energy beam and a second group having a basic property.

When the resist film formed out of the second pattern forming material is selectively irradiated with the energy beam, the first group is dissolved into the acid in the exposed area on the resist film, so that the generated acid can be neutralized with the second group having the basic property, while the unexposed area on the resist film remains to be basic. Accordingly, merely the unexposed area on the resist film can selectively retain the basic property, resulting in realizing the positive type surface imaging process.

The first group in the second pattern forming material is preferably a group for generating sulfonic acid. In this case, owing to the strong acidic property of sulfonic acid, the exposed area on the resist film can be completely neutralized, while the unexposed area on the resist film remains to be basic. Accordingly, the unexposed area of the resist film can selectively retain the basic property.

The copolymer in the second pattern forming material is preferably a binary copolymer represented by the following general formula or a ternary or higher copolymer obtained by further polymerizing the binary copolymer with another group:

Chemical Formula 2:

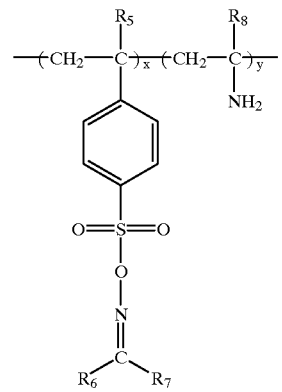

wherein $R_5$ indicates a hydrogen atom or an alkyl group; $R_6$ and $R_7$ independently indicate a hydrogen atom, an alkyl group, a phenyl group or an alkenyl group, or together indicate a cyclic alkyl group, a cyclic alkenyl group, a cyclic alkyl group having a phenyl group or a cyclic alkenyl group having a phenyl group; $R_8$ indicates a hydrogen atom or an alkyl group; x satisfies a relationship of $0<x<1$; and y satisfies a relationship of $0<y<1$.

In this case, amine can exhibit its strong catalytic function in the formation of the metal oxide film in the unexposed area on the resist film, so that the unexposed area on the resist film can selectively retain the strong basic property. On the other hand, in the exposed area of the resist film, since sulfonic acid having a strong acidic property is generated, amine having a strong basic property can be completely neutralized. Accordingly, merely the unexposed area on the resist film can selectively retain the strong basic property.

The third pattern forming material of this invention comprises a copolymer including a first group for generating an acid through irradiation with a first energy beam having a first energy band; and a second group for generating a base through irradiation with a second energy beam having a second energy band different from the first energy band.

In the resist film formed out of the third pattern forming material, the acid is generated through the irradiation with the first energy beam, and the base is generated through the irradiation with the second energy beam. Accordingly, when the pattern exposure of the resist film using the first energy beam is effected and then the entire surface exposure using the second energy beam is effected, in the exposed area of the first energy beam on the resist film, the acid generated through the pattern exposure using the first energy beam is neutralized with the base generated through the entire surface exposure using the second energy beam. On the other hand, the unexposed area of the first energy beam on the resist film attains a basic property through the entire surface exposure using the second energy beam. Contrarily, when the pattern exposure of the resist film using the second energy beam is effected and then the entire surface exposure using the first energy beam is effected, in the exposed area of the second energy beam on the resist film, the base generated through the pattern exposure using the second energy beam is neutralized with the acid generated through the entire surface exposure using the first energy beam. On the other hand, the unexposed area of the second energy beam on the resist film attains an acidic property through the entire surface exposure using the first energy beam. Accordingly, the positive type surface imaging process can be realized.

Furthermore, since the third pattern forming material comprises the copolymer including the first group for generating the acid through the irradiation with the first energy beam and the second group for generating the base through the irradiation with the second energy beam, the acid or the base cannot be generated until the irradiation with the energy beam, namely, the resist film remains to be neutral until the irradiation with the energy beam. Accordingly, the pattern forming material can be prevented from being changed in its property by an acid or a base during pre-baking, resulting in forming a stable resist film.

The first group in the third pattern forming material is preferably a group for generating sulfonic acid. In this case, when the pattern exposure is effected by using the first energy beam, owing to the strong acidic property of sulfonic acid, the exposed area of the first energy beam on the resist film can be completely neutralized, while the unexposed area of the first energy beam on the resist film retains the basic property. Accordingly, merely the unexposed area of the first energy beam on the resist film can selectively retain the basic property. Contrarily, when the pattern exposure is effected by using the second energy beam, the unexposed area of the second energy beam on the resist film can exhibit a strong catalytic function in the formation of the oxide film. Accordingly, merely the unexposed area of the second energy beam on the resist film can selectively retain the strong acidic property.

The copolymer in the third pattern forming material is preferably a binary copolymer represented by the following general formula or a ternary or higher copolymer obtained by further polymerizing the binary copolymer with another group:

Chemical Formula 3:

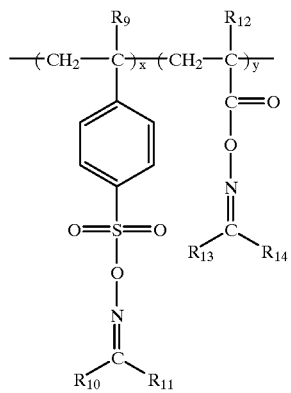

wherein $R_9$ indicates a hydrogen atom or an alkyl group; $R_{10}$ and $R_{11}$ independently indicate a hydrogen atom, an alkyl group, a phenyl group or an alkenyl group, or together indicate a cyclic alkyl group, a cyclic alkenyl group, a cyclic alkyl group having a phenyl group or a cyclic alkenyl group having a phenyl group; $R_{12}$ indicates a hydrogen atom or an alkyl group; $R_{13}$ and $R_{14}$ independently indicate a hydrogen atom, an alkyl group, a phenyl group or an alkenyl group, or together indicate a cyclic alkyl group, a cyclic alkenyl group, a cyclic alkyl group having a phenyl group or a cyclic alkenyl group having a phenyl group; x satisfies a relationship of $0<x<1$; and y satisfies a relationship of $0<y<1$.

In this case, sulfonic acid having a strong acidic property is generated through the irradiation of the resist film with the first energy beam, and amine having a strong basic property is generated through the irradiation with the second energy beam. Therefore, when the pattern exposure is effected by using the first energy beam, the unexposed area of the first energy beam on the resist film retains the strong basic property, while the exposed area of the first energy beam on the resist film can be completely neutralized. Contrarily, when the pattern exposure is effected by using the second energy beam, the unexposed area of the second energy beam on the resist film retains the strong acidic property, while the exposed area of the second energy beam on the resist film can be completely neutralized.

The first pattern forming method of this invention comprises a first step of forming a resist film by coating a semiconductor substrate with a pattern forming material including a copolymer having a first group for generating a base through irradiation with an energy beam and a second group having an acidic property; a second step of selectively irradiating the resist film with the energy beam by using a mask having a desired pattern, generating the base in an exposed area on the resist film and neutralizing the generated base with the second group; a third step of supplying metal alkoxide onto the resist film and forming a metal oxide film on a surface of an unexposed area on the resist film; and a fourth step of forming a resist pattern by dry-etching the resist film by using the metal oxide film as a mask.

According to the first pattern forming method, through the irradiation of the resist film with the energy beam, the generated base is neutralized with the second group having the acidic property in the exposed area on the resist film, while the unexposed area on the resist film remains to be acidic. When the metal alkoxide is supplied to the resist film, the metal oxide film cannot be formed in the exposed area because the exposed area on the resist film has been neutralized, but the metal oxide film is selectively formed in the unexposed area on the resist film. Accordingly, through the dry etching of the resist film using the metal oxide film as a mask, it is possible to form a fine-line positive type resist pattern having a satisfactory shape.

Furthermore, according to the first pattern forming method, the acid works as the catalyst in the formation of the metal oxide film in the unexposed area on the resist film, and hence, the resultant metal oxide film can attain a high density and sufficient strength.

In the first pattern forming method, the third step preferably includes a step of allowing the unexposed area on the resist film to adsorb water. In this case, since water can be diffused into a deep portion from the surface of the unexposed area on the resist film, the metal oxide film formed on the surface of the unexposed area on the resist film can attain a large thickness.

In the first pattern forming method, the second group is preferably a group including a sulfonic acid group. In this case, owing to the strong acidic property of sulfonic acid, it is possible to form the metal oxide film having a sufficient density in the unexposed area on the resist film by using the strong catalytic function of sulfonic acid. As a result, the selectivity in the dry etching can be improved. Thus, it is possible to form a more fine-line positive type resist pattern having a satisfactory shape.

The copolymer used in the first pattern forming method is preferably a binary copolymer represented by the following general formula or a ternary or higher copolymer obtained by further polymerizing the binary copolymer with another group:

Chemical Formula 4:

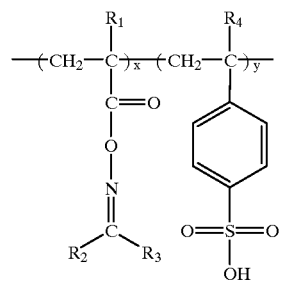

wherein $R_1$ indicates a hydrogen atom or an alkyl group; $R_2$ and $R_3$ independently indicate a hydrogen atom, an alkyl group, a phenyl group or an alkenyl group, or together indicate a cyclic alkyl group, a cyclic alkenyl group, a cyclic alkyl group having a phenyl group or a cyclic alkenyl group having a phenyl group; $R_4$ indicates a hydrogen atom or an alkyl group; x satisfies a relationship of $0<x<1$; and y satisfies a relationship of $0<y<1$.

In this case, since sulfonic acid can exhibit its strong catalytic function in the formation of the metal oxide film in the unexposed area on the resist film, the unexposed area on the resist film can selectively retain the strong acidic property. Therefore, the metal oxide film having a sufficient density can be formed by supplying the metal alkoxide. Furthermore, in the exposed area on the resist film, since amine having a strong basic property is generated, sulfonic acid having a strong acidic property can be completely neutralized. Therefore, the metal oxide film cannot be formed in the exposed area. In this manner, the selectivity in the dry etching is high, and hence, it is possible to form a more fine-line positive type resist pattern having a satisfactory shape.

The second pattern forming method of this invention comprises a first step of forming a resist film by coating a semiconductor substrate with a pattern forming material including a copolymer having a first group for generating an acid through irradiation with an energy beam and a second group having a basic property; a second step of selectively irradiating the resist film with the energy beam by using a mask having a desired pattern, generating the acid in an exposed area on the resist film and neutralizing the generated acid with the second group; a third step of supplying metal alkoxide onto the resist film and forming a metal oxide film on a surface of an unexposed area on the resist film; and a fourth step of forming a resist pattern by dry-etching the resist film by using the metal oxide film as a mask.

According to the second pattern forming method, through the irradiation of the resist film with the energy beam, the generated acid is neutralized with the second group having the basic property in the exposed area on the resist film, while the unexposed area on the resist film remains to be basic. When the metal alkoxide is supplied to the resist film, the metal oxide film cannot be formed in the exposed area because the exposed area on the resist film has been neutralized, but the metal oxide film is selectively formed in the unexposed area on the resist film. Accordingly, through the dry etching of the resist film using the metal oxide film as a mask, it is possible to form a fine-line positive type resist pattern having a satisfactory shape.

Furthermore, according to the second pattern forming method, the base works as a catalyst in the formation of the metal oxide film in the unexposed area on the resist film. Therefore, the speed for forming the metal oxide film can be improved, resulting in improving throughput.

In the second pattern forming method, the third step preferably includes a step of allowing the unexposed area on the resist film to adsorb water. In this case, since water is diffused into a deep portion from the surface of the unexposed area on the resist film, the metal oxide film formed in the unexposed area on the resist film can attain a large thickness.

In the second pattern forming method, the first group is preferably a group for generating sulfonic acid. In this case, owing to the strong acidic property of sulfonic acid, the exposed area on the resist film can be completely neutralized, while the unexposed area on the resist film retains the basic property. Therefore, the metal oxide film can be formed merely in the unexposed area on the resist film with high selectivity. Accordingly, it is possible to form a more fine-line positive resist pattern having a satisfactory shape.

The copolymer used in the second pattern forming method is preferably a binary copolymer represented by the following general formula or a ternary or higher copolymer obtained by further polymerizing the binary copolymer with another group:

Chemical Formula 5:

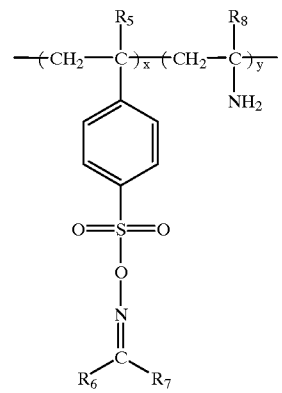

wherein $R_5$ indicates a hydrogen atom or an alkyl group; $R_6$ and $R_7$ independently indicate a hydrogen atom, an alkyl group, a phenyl group or an alkenyl group, or together indicate a cyclic alkyl group, a cyclic alkenyl group, a cyclic alkyl group having a phenyl group or a cyclic alkenyl group having a phenyl group; $R_8$ indicates a hydrogen atom or an alkyl group; x satisfies a relationship of $0<x<1$; and y satisfies a relationship of $0<y<1$.

In this case, in the unexposed area on the resist film, amine exhibits its strong catalytic function, and hence, the metal oxide film with a sufficient density can be formed. On the other hand, in the exposed area on the resist film, since sulfonic acid having a strong acidic property is generated, amine having a strong basic property can be completely neutralized. As a result, the selectivity in the dry etching is very high, and it is possible to form a more fine-line positive resist pattern having a satisfactory shape.

The third pattern forming method of this invention comprises a first step of forming a resist film by coating a semiconductor substrate with a pattern forming material including a copolymer having a first group for generating an acid through irradiation with a first energy beam having a first energy band and a second group for generating a base through irradiation with a second energy beam having a second energy band different from the first energy band; a second step of selectively irradiating the resist film with the first energy beam by using a mask having a desired pattern, and generating the acid in an exposed area of the first energy beam on the resist film; a third step of irradiating an entire surface of the resist film with the second energy beam, generating the base on the entire surface of the resist film, and neutralizing the generated base with the acid generated in the exposed area of the first energy beam on the resist film; a fourth step of supplying metal alkoxide onto the resist film and forming a metal oxide film on a surface of an unexposed area of the first energy beam on the resist film; and a fifth step of forming a resist pattern by dry-etching the resist film by using the metal oxide film as a mask.

According to the third pattern forming method, in the exposed area of the first energy beam on the resist film, since the acid generated through the pattern exposure using the first energy beam is neutralized with the base generated through the entire surface exposure using the second energy beam, the metal oxide film cannot be formed in the exposed area. On the other hand, in the unexposed area of the first energy beam on the resist film, since the base is generated through the entire surface exposure using the second energy beam, the metal oxide film can be formed owing to the catalytic function of the base by supplying the metal alkoxide to the resist film. Accordingly, through the dry etching of the resist film using the metal oxide film as a mask, a positive type resist pattern can be formed.

Furthermore, according to the third pattern forming method, since the base works as the catalyst in the formation of the metal oxide film in the unexposed area of the first energy beam on the resist film, the speed for forming the metal oxide film can be improved, resulting in improving the throughput.

In the third pattern forming method, the first group is preferably a group for generating sulfonic acid. In this case, owing to the strong acidic property of sulfonic acid, the exposed area of the first energy beam on the resist film can be completely neutralized, while the unexposed area of the first energy beam on the resist film retains the basic property. Accordingly, the metal oxide film can be formed merely in the unexposed area of the first energy beam on the resist film with very high selectivity. As a result, it is possible to form a more fine-line positive type resist pattern having a satisfactory shape.

The fourth pattern forming method of this invention comprises a first step of forming a resist film by coating a semiconductor substrate with a pattern forming material including a copolymer having a first group for generating a base through irradiation with a first energy beam having a first energy band and a second group for generating an acid through irradiation with a second energy beam having a second energy band different from the first energy band; a second step of selectively irradiating the resist film with the first energy beam by using a mask having a desired pattern, and generating the base in an exposed area of the first energy beam on the resist film; a third step of irradiating an entire surface of the resist film with the second energy beam, generating the acid on the entire surface of the resist film, and neutralizing the generated acid with the base generated in the exposed area of the first energy beam on the resist film; a fourth step of supplying metal alkoxide onto the resist film and forming a metal oxide film on a surface of an unexposed area of the first energy beam on the resist film; and a fifth step of forming a resist pattern by dry-etching the resist film by using the metal oxide film as a mask.

According to the fourth pattern forming method, in the exposed area of the first energy beam on the resist film, since the base generated through the pattern exposure using the first energy beam is neutralized with the acid generated through the entire surface exposure using the second energy beam, the metal oxide film cannot be formed in the exposed area. On the other hand, in the unexposed area of the first energy beam on the resist film, since the acid is generated through the entire surface exposure using the second energy beam, the metal oxide film can be formed owing to the catalytic function of the acid by supplying the metal alkoxide. Accordingly, through the dry etching of the resist film using the metal oxide film as a mask, a positive type resist pattern can be formed.

Furthermore, according to the fourth pattern forming method, since the metal oxide film can be formed owing to the catalytic function of the acid in the unexposed area of the first energy beam on the resist film, the resultant metal oxide film can attain a high density and sufficient strength.

In the fourth pattern forming method, the second group is preferably a group for generating sulfonic acid. In this case, since sulfonic acid is a strong acid, it is possible to form a metal oxide film having a sufficient density in the unexposed area of the first energy beam on the resist film owing to the strong catalytic function of sulfonic acid. As a result, the selectivity in the dry etching is high, and it is possible to form a more fine-line positive type resist pattern having a satisfactory shape.

In the third or fourth pattern forming method, the fourth step preferably includes a step of allowing the unexposed area on the resist film to adsorb water. In this case, since water is diffused into a deep portion from the surface of the unexposed area of the first energy beam on the resist film, the metal oxide film formed in the unexposed area can attain a large thickness.

The copolymer used in the third or fourth pattern forming method is preferably a binary copolymer represented by the following general formula or a ternary or higher copolymer obtained by further polymerizing the binary copolymer with another group:

Chemical Formula 6:

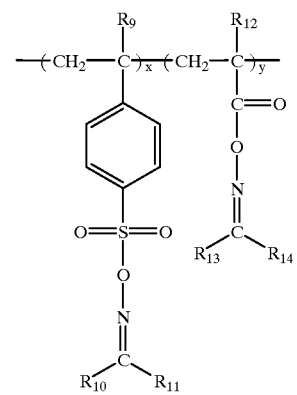

wherein $R_9$ indicates a hydrogen atom or an alkyl group;
$R_{10}$ and $R_{11}$ independently indicate a hydrogen atom, an alkyl group, a phenyl group or an alkenyl group, or together indicate a cyclic alkyl group, a cyclic alkenyl group, a cyclic alkyl group having a phenyl group or a cyclic alkenyl group having a phenyl group; $R_{12}$ indicates a hydrogen atom or an alkyl group; $R_{13}$ and $R_{14}$ independently indicate a hydrogen atom, an alkyl group, a phenyl group or an alkenyl group, or together indicate a cyclic alkyl group, a cyclic alkenyl group, a cyclic alkyl group having a phenyl group or a cyclic alkenyl group having a phenyl group; x satisfies a relationship of $0<x<1$; and y satisfies a relationship of $0<y<1$.

When the copolymer represented by Chemical Formula 6 is used in the third pattern forming method, since sulfonic acid generated through the pattern exposure using the first energy beam is neutralized with amine generated through the entire surface exposure using the second energy beam, the metal oxide film cannot be formed in the exposed area of the first energy beam on the resist film. On the other hand, in the unexposed area of the first energy beam on the resist film, since amine having a strong basic property is generated through the entire surface exposure using the second energy beam, the metal oxide film with a sufficient density can be formed by supplying the metal alkoxide to the resist film. Accordingly, the selectivity in the dry etching is very high, and it is possible to form a more fine-line positive resist pattern having a satisfactory shape.

When the copolymer represented by Chemical Formula 6 is used in the fourth pattern forming method, since amine generated through the pattern exposure using the first energy beam is neutralized with sulfonic acid generated through the entire surface exposure using the second energy beam, the metal oxide film cannot be formed in the exposed area of the first energy beam on the resist film. On the other hand, in the unexposed area of the first energy beam on the resist film, since sulfonic acid having a strong acidic property is generated through the entire surface exposure using the second energy beam, the metal oxide film with a sufficient density can be formed by supplying the metal alkoxide. Accordingly, the selectivity in the dry etching is very high, and it is possible to form a more fine-line positive type resist pattern having a satisfactory shape.

DETAILED DESCRIPTION OF THE INVENTION

EMBODIMENT 1

FIGS. 1(a) through 1(d) are sectional views for showing procedures of a pattern forming method of a first embodiment.

As a resist material, a copolymer represented by Chemical Formula 7 dissolved in diglyme is used.

Chemical Formula 7:

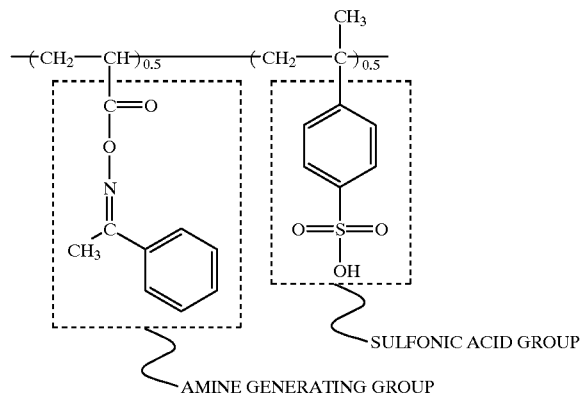

Figure 1A:
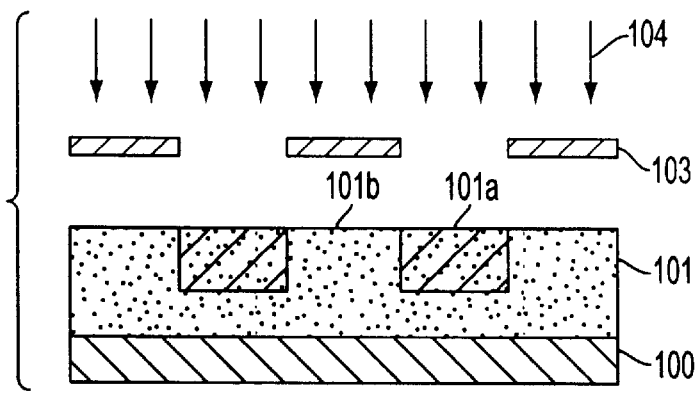
FIGS. 1(a) through 1(d) are sectional views for showing procedures of a pattern forming method according to a first embodiment of the invention.

First, as is shown in FIG. 1(a), the resist material is spin-coated on a semiconductor substrate 100 of silicon, and the resultant semiconductor substrate is annealed at a temperature of 90° C. for 90 seconds, thereby forming a resist film 101 with a thickness of 1 μm. At-this point, no peeling is observed, and the resist film 101 has satisfactory adhesion. Then, by using a mask 103, the substrate is irradiated with a KrF excimer laser 104, i.e., an energy beam, thereby transferring a pattern of the mask 103 onto the resist film 101. In this manner, O-acryloyl-acetophenone-oxime (AAPO) is dissolved to generate amine on the surface of an exposed area 101a of the resist film 101. A reaction caused through the exposure of the resist material is shown as Chemical Formula 8.

Chemical Formula 8:

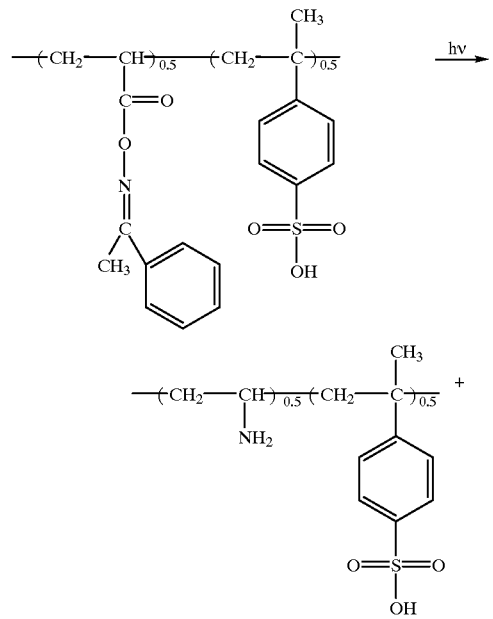

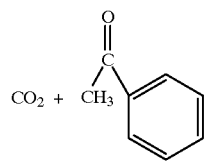

An unexposed area 101b of the resist film 101 has a strong acidic property owing to the function of a sulfonic acid group in Chemical Formula 7. On the other hand, in the exposed area 101a of the resist film 101, AAPO in Chemical Formula 7 is dissolved into amine having a basic property, and the amine neutralizes the acidic property resulting from the function of the sulfonic acid group. At this point, since the unexposed area 101b has the strong acidic property, water is more easily adsorbed in the unexposed area 101b than in the exposed area 101a which has been neutralized. In other words, since the unexposed area 101b includes the group having the strong acidic property, a hydrogen bond with water is strengthened in the unexposed area 101b, and hence water can be easily adsorbed. In contrast, in the exposed area 101a, a hydrogen bond with water is weakened by the neutralization, and water cannot be easily adsorbed.

Figure 1B:
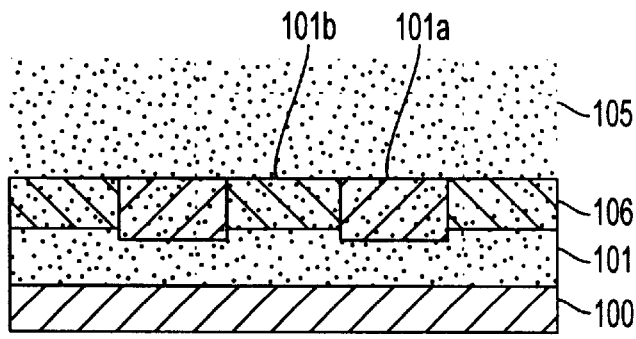

Next, as is shown in FIG. 1(b), the semiconductor substrate 100 is allowed to stand in air with a relative humidity of 95% at a temperature of 30° C. for 30 minutes, thereby supplying water vapor 105 onto the surface of the resist film 101. In this manner, the water vapor 105 is adsorbed by the surface of the unexposed area 101b, which can easily adsorb water, and the adsorbed water is diffused into a deep portion, for example, at a depth of 100 nm from the surface of the unexposed area 101b. Since the exposed area 101a has been neutralized, water is difficult to be adsorbed. Thus, a water adsorbing layer 106 is selectively formed in the unexposed area 101b.

Figure 1C:
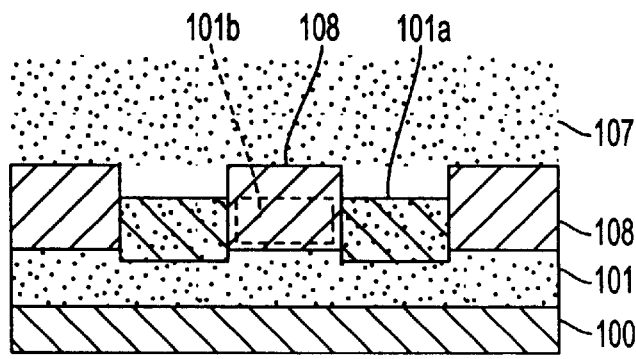

Then, as is shown in FIG. 1(c), while retaining the semiconductor substrate 100 in the air with the relative humidity of 95% at a temperature of 30° C., vapor 107 of methyltriethoxysilane (MTEOS), i.e., metal alkoxide, is sprayed onto the surface of the resist film 101 for 3 minutes, thereby selectively forming an oxide film 108 on the surface of the unexposed area 101b of the resist film 101. In this case, an acid ($H^+$) derived from sulfonic acid works as a catalyst in hydrolysis and dehydration of MTEOS, so that the oxide film 108 can be formed. Therefore, the oxide film 108 is formed merely a portion where both $H^+$ serving as the catalyst and water are present.

According to the first embodiment, the oxide film is not formed in the exposed area 101a of the resist film 101 because sulfonic acid is neutralized by the generated amine and loses its function as the catalyst and water cannot be easily adsorbed in the exposed area 101a. On the other hand, the oxide film 108 is formed in the unexposed area 101b of the resist film 101 because He serving as the catalyst is present and a sufficient amount of water has been adsorbed in the unexposed area 010b.

Figure 1D:
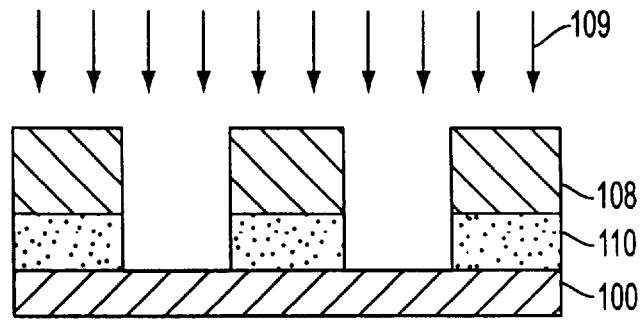

Next, as is shown in FIG. 1(d), by using the oxide film 108 as a mask, the semiconductor substrate 100 is subjected to RIE (reactive ion etching) using $O_2$ plasma 109, thereby forming a resist pattern 110. In this case, the RIE using $O_2$ plasma is effected by using a parallel plate reactive ion etching system under conditions of a power of 900 W, a pressure of 0.7 Pa and a flow rate of 40 SCCM.

In this embodiment, since the oxide film 108 is selectively formed in the unexposed area 101b alone and the etching is effected by using the oxide film 108, the positive type resist pattern 110 having a vertical section can be formed in the unexposed area 101b.

Furthermore, since the water vapor 105 is supplied to the resist film 101 in the procedure shown in FIG. 1(b), water is diffused into the deep portion from the surface of the unexposed area 101b of the resist film 101, so that the oxide film 108 can be grown toward the inside of the resist film 101. As a result the oxide film 108 can attain a large thickness.

In addition since MTEOS is supplied to the resist film 101 in the air with the relative humidity of 95% in the procedure shown in FIG. 1(c), equilibrium of water can be retained so that the water having been adsorbed by the resist film 101 can be prevented from evaporating and that water can be supplied in a sufficient amount for the formation of the oxide film 108. As a result, the resultant oxide film 108 can attain a thickness sufficiently large for withstanding the RIE using $O_2$ plasma.

After the supply of MTEOS, the resist film 101 can be allowed to stand in vacuum so as to evaporate alcohol included in the oxide film 108. Thus, the flow of the oxide film 108 can be avoided.

In this manner, the resist film 101 of the resist material including an acidic group is subjected to the pattern exposure in this embodiment. In the exposed area 101a, a base is generated to neutralize the acidic property of the exposed area 101a, and the oxide film 108 is selectively formed in the unexposed area 101b alone, so as to be used in etching the resist film 101. Accordingly, it is possible to form the positive type fine-line resist pattern 110 having a satisfactory shape.

Also, since water is forcedly adsorbed in the unexposed area 101b before forming the oxide film 108, the resultant oxide film 108 can attain a large thickness required for the dry development by the RIE using $O_2$ plasma.

In the resist material used in the first embodiment, the copolymer represented by Chemical Formula 7 includes styrene sulfonic acid as the acidic group. However, the acidic group is not limited to styrene sulfonic acid but can be any group having a strong acidic property and including a group represented by Chemical Formula 9.

Chemical Formula 9:

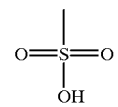

Furthermore, MTEOS is used as the metal alkoxide in this embodiment, but MTEOS can be replaced with any other metal alkoxide in a gas or liquid phase such as $Si(OCH_3)_4$ (tetramethoxysilane), $Si(OC_2H_5)_4$ (tetraethoxysilane), $Ti(OC_2H_5)_4$, $Ge(OC_2H_5)_4$, $Al(OC_2H_5)_3$, and $Zr(OC_2H_5)_3$.

Also, the dry development is effected by the RIE using $O_2$ plasma in this embodiment, but ECR (electron cyclotron resonance etching) using $O_2$ plasma is adoptable instead.

Moreover, a light source for the exposure is the KrF excimer laser in this embodiment, but an i-line, an ArF excimer laser, EB, X-rays or the like can be used.

Furthermore, in the procedure for diffusing water in the surface of the unexposed area 101b of the resist film 101 in this embodiment, the semiconductor substrate 100 is allowed to stand in the water vapor, but water in a liquid phase can be supplied to the resist film 101 on the semiconductor substrate 100 instead. However, water can be more rapidly diffused and the thickness of the oxide film 108 can be more increased when the water is supplied in a gas phase than in a liquid phase, and hence, water is preferably supplied in a gas phase.

EMBODIMENT 2

FIGS. 2(a) through 2(d) are sectional views for showing procedures of a pattern forming method of a second embodiment.

As a resist material, a copolymer represented by Chemical Formula 10 dissolved in diglyme is used.

Chemical Formula 10:

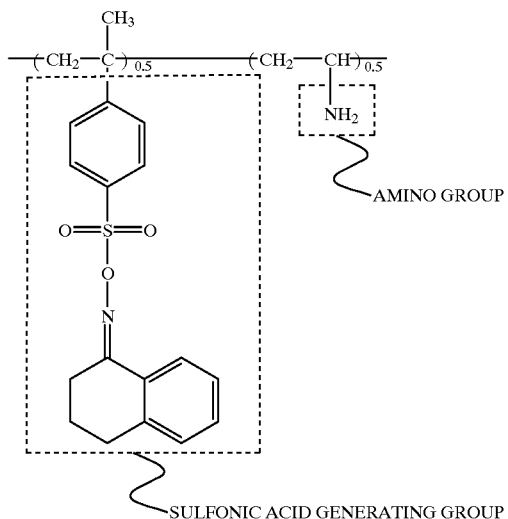

Figure 2A:
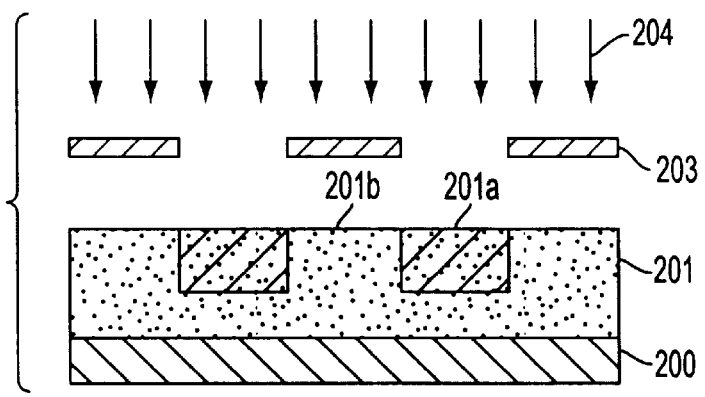
FIGS. 2(a) through 2(d) are sectional views for showing procedures of a pattern forming method according to a second embodiment of the invention.

First, as is shown in FIG. 2(a), similarly to the first embodiment, the resist material is spin-coated on a semiconductor substrate 200 of silicon; and the semiconductor substrate 200 is annealed at a temperature of 90° C. for 90 seconds, thereby forming a resist film 201 with a thickness of 1 μm. At this point, no peeling is observed, and the resultant resist film 201 has satisfactory adhesion. Then, by using a mask 203, the semiconductor substrate 200 is irradiated with a KrF excimer laser 204, i.e., an energy beam, thereby transferring a pattern of the mask 203 onto the resist film 201. In this manner, on the surf ace of an exposed area 201a of the resist film 201, 1,2,3,4-tetrahydronaphthyridinenimino-p-styrene sulfonate (NISS) is dissolved to generate sulfonic acid. A reaction caused through the exposure of the resist material is shown as Chemical Formula 11.

Chemical Formula 11:

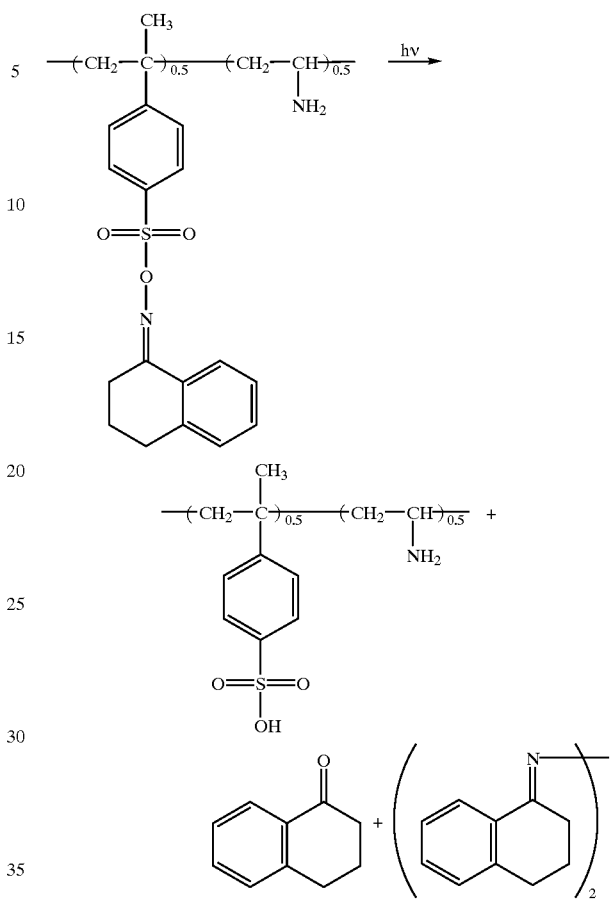

An unexposed area 201b of the resist film 201 has a basic property owing to the function of an amino group in Chemical Formula 10. On the other hand, in the exposed area 201a of the resist film 201, NISS in Chemical Formula 10 is dissolved into sulfonic acid having a strong acidic property, so that the basic property derived from the function of the amino group can be neutralized. In this case, since the unexposed area 201b has the strong basic property, water can be more easily adsorbed in the unexposed area 201b than in the exposed area 201a having been neutralized. Specifically, since the unexposed area 201b includes the group having the strong basic property, a hydrogen bond with water is strengthened, and water can be easily adsorbed. In contrast, in the exposed area 201a, a hydrogen bond with water is weakened by the neutralization, and water cannot be easily adsorbed.

Figure 2B:
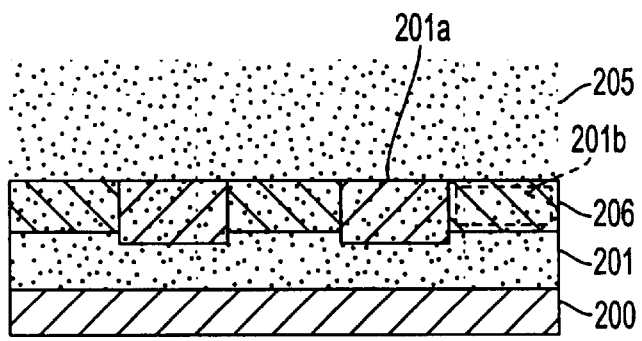

Next, as is shown in FIG. 2(b), the semiconductor substrate 200 is allowed to stand in air with a relative humidity of 95% at a temperature of 30° C. for 30 minutes, thereby supplying water vapor 205 onto the surface of the resist film 201. In this manner, the water vapor 205 is adsorbed by the surface of the unexposed area 201b, which can easily adsorb water, and the adsorbed water is diffused into a deep portion, for example, at a depth of 100 nm from the surface of the unexposed area 201b of the resist film 201. Since the exposed area 201a has been neutralized, water cannot be easily adsorbed. Thus, a water adsorbing layer 206 is selectively formed in the unexposed area 201b.

Figure 2C:
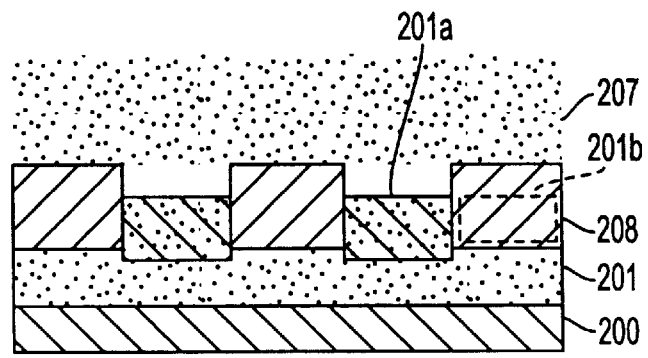

Then, as is shown in FIG. 2(c), while retaining the semiconductor substrate 200 in the air with the relative humidity of 95% at a temperature of 30° C., vapor 207 of MTEOS, i.e., metal alkoxide, is sprayed onto the surface of the resist film 201 for 3 minutes, thereby selectively forming an oxide film 208 on the surface of the unexposed area 201b of the resist film 201. In this case, the base derived from the amino group works as a catalyst in the hydrolysis and dehydration of MTEOS, so that the oxide film 208 can be formed. Therefore, the oxide film 208 is formed merely in a portion where both the base serving as the catalyst and water are present.

According to the second embodiment, in the exposed area 201a of the resist film 201, since the amino group is neutralized by generated sulfonic acid and loses its function as the catalyst and water cannot be easily adsorbed, the oxide film cannot be formed. In contrast, in the unexposed area 201b of the resist film 201, the base serving as the catalyst is present and a sufficient amount of water has been adsorbed, the oxide film 208 can be formed.

Figure 2D:
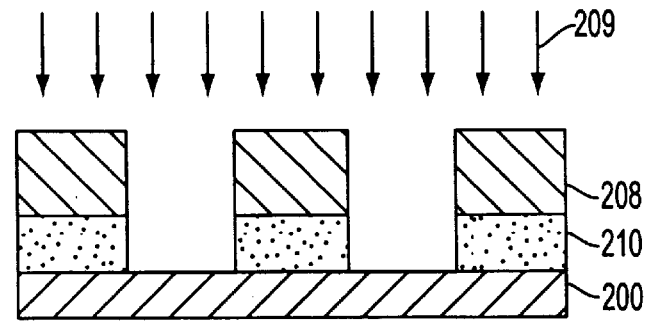

Then, as is shown in FIG. 2(d), by using the oxide film 208 as a mask, the RIE using $O_2$ plasma is effected, thereby forming a resist pattern 210. The RIE using $O_2$ plasma is effected by using a parallel plate reactive ion etching system under conditions of a power of 900 W, a pressure of 0.7 Pa and a flow rate of 40 SCCM.

In this embodiment, since the oxide film 208 is selectively formed in the unexposed area 201b alone to be used in the etching, the positive type resist pattern 210 having a vertical section can be formed in the unexposed area 201b.

Furthermore, since the water vapor 205 is supplied to the resist film 201 in the procedure shown in FIG. 2(b), water is diffused into the deep portion from the surface of the unexposed area 201b of the resist film 201, so that the oxide film 208 can be grown toward the inside of the resist film 201. As a result, the oxide film 208 can attain a large thickness.

In addition, since MTEOS is supplied to the resist film 201 in the air with the relative humidity of 95% in the procedure shown in FIG. 2(c), equilibrium of water can be retained so that the water having been adsorbed by the resist film 201 can be prevented from evaporating and that water can be supplied in a sufficient amount for the formation of the oxide film 208. As a result, the resultant oxide film 208 can attain a thickness sufficiently large for withstanding the RIE using $O_2$ plasma.

After the supply of MTEOS, the resist film 201 can be allowed to stand in vacuum so as to evaporate alcohol included in the oxide film 208. Thus, the flow of the oxide film 208 can be avoided.

In this manner, the resist film 201 of the resist material including a basic group is subjected to the pattern exposure in this embodiment. In the exposed area 201a, a strong acid is generated to neutralize the basic property of the exposed area 201a, and the oxide film 208 is selectively formed in the unexposed area 201b alone, so as to be used in etching the resist film 201. Accordingly, it is possible to form the positive type fine-line resist pattern 210 having a satisfactory shape.

Also, since water is forcedly adsorbed in the unexposed area 201b before forming the oxide film 208, the resultant oxide film 208 can attain a large thickness required for the dry development by the RIE using $O_2$ plasma.

In the resist material used in the second embodiment, the copolymer represented by Chemical Formula 10 includes the amono group as the basic group. However, the basic group is not limited to the amino group but can be any group having a basic property.

Furthermore, MTEOS is used as the metal alkoxide in this embodiment, but MTEOS can be replaced with any other metal alkoxide in a gas or liquid phase such as $Si(OCH_3)_4$ (tetramethoxysilane), $Si(OC_2H_5)_4$ (tetraethoxysilane), $Ti(OC_2H_5)_4$, $Ge(OC_2H_5)_4$, $Al(OC_2H_5)_3$, and $Zr(OC_2H_5)_3$.

Also, the dry development is effected by the RIE using $O_2$ plasma in this embodiment, but ECR (electron cyclotron resonance etching) using $O_2$ plasma is adoptable instead.

Moreover, a light source for the exposure is the KrF excimer laser in this embodiment, but an i-line, an ArF excimer laser, ES, X-rays or the like can be used.

Furthermore, in the procedure for diffusing water in the surface of the unexposed area 201b of the resist film 201 in this embodiment, the semiconductor substrate 200 is allowed to stand in the water vapor, but water in a liquid phase can be supplied to the resist film 201 on the semiconductor substrate 200 instead. However, water can be more rapidly diffused and the thickness of the oxide film 208 can be more increased when the water is supplied in a gas phase than in a liquid phase, and hence, water is preferably supplied in a gas phase.

EMBODIMENT 3

FIGS. 3(a) through 3(c), 4(a) and 4(b) are sectional views for showing procedures of a pattern forming method of a third embodiment.

As a resist material, a copolymer represented by Chemical Formula 12 dissolved in diglyme is used. A sulfonic acid generating group selectively generates sulfonic acid through irradiation with an ArF excimer laser, and an amine generating group selectively generates amine through irradiation with an i-line.

Chemical Formula 12:

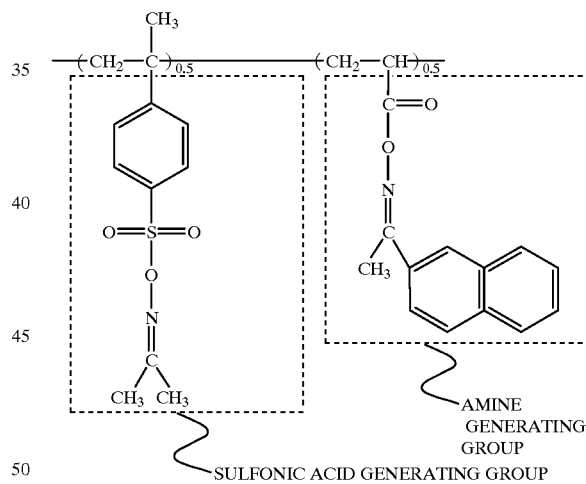

Figure 3A:
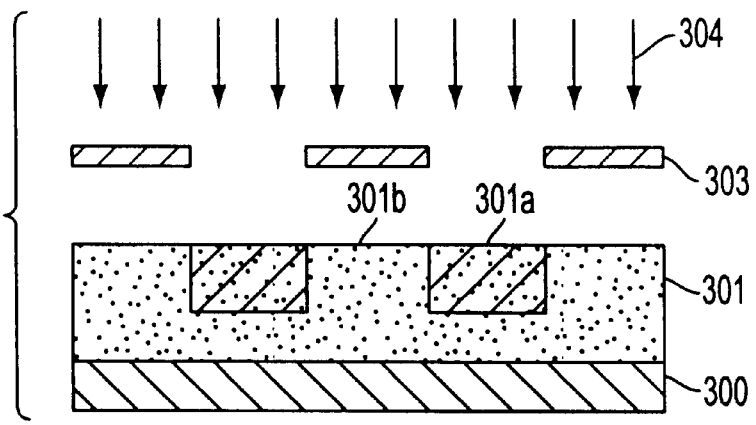
FIGS. 3(a) through 3(c) are sectional views for showing procedures of a pattern forming method according to a third embodiment of the invention.

First, as is shown in FIG. 3(a), similarly to the first embodiment, the resist material is spin-coated on a semiconductor substrate 300 of silicon, and the semiconductor substrate is annealed at a temperature of 90° C. for 90 seconds, thereby forming a resist film 301 with a thickness of 1 μm. At this point, no peeling is observed, and the resultant resist film 301 has satisfactory adhesion. Then, by using a mask 303, the semiconductor substrate 300 is irradiated with an ArF excimer laser 304, i.e., a first energy beam, thereby transferring a pattern of the mask 303 onto the resist film 301. In this manner, on the surface of an exposed area 301a of the resist film 301, the sulfonic acid generating group is dissolved into sulfonic acid, and the exposed area 301a attains a strong acidic property. A reaction caused through the exposure of the resist material is shown as Chemical Formula 13.

Chemical Formula 13:

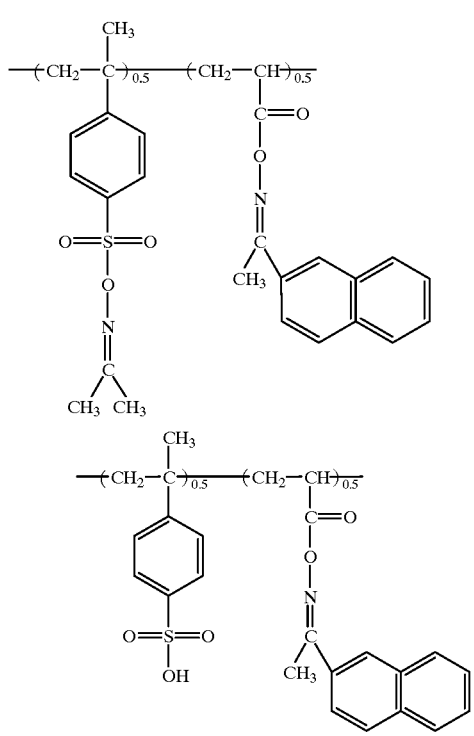

Figure 3B:
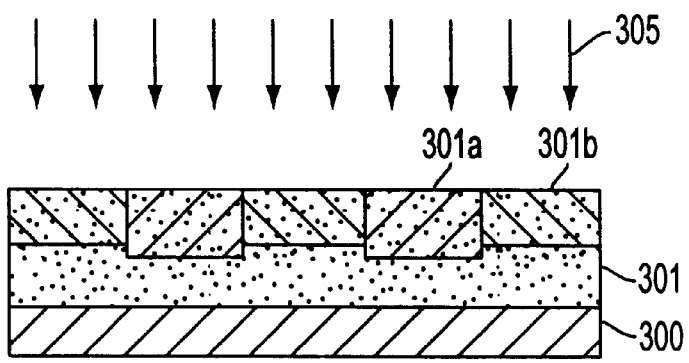

Next, as is shown in FIG. 3(b), the entire surface of the resist film 301 is irradiated with an i-line 305, i.e., a second energy beam. In this manner, in the exposed area 301a where the pattern has been transferred through the irradiation with the ArF excimer laser 304, amine having a basic property is generated through the entire surface exposure with the i-line 305 as is shown in a reaction formula of Chemical Formula 14. Thus, the acidic property of the exposed area 301a is neutralized.

Chemical Formula 14:

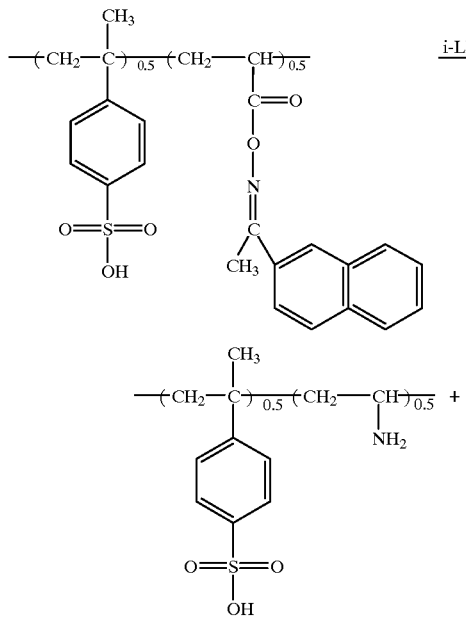

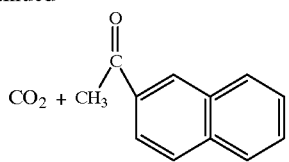

On the other hand, in an unexposed area 301b where the pattern exposure has not been effected through the irradiation with ArF excimer laser 304, amine is generated on the surface of the resist film 301 through the entire surface exposure with the i-line 305 as is shown in a reaction formula of Chemical Formula 15, so that the unexposed area 301b attains a basic property. At this point, since the unexposed area 301b has a strong basic property, water can be more easily adsorbed than in the exposed area 301a having been neutralized.

Chemical Formula 15:

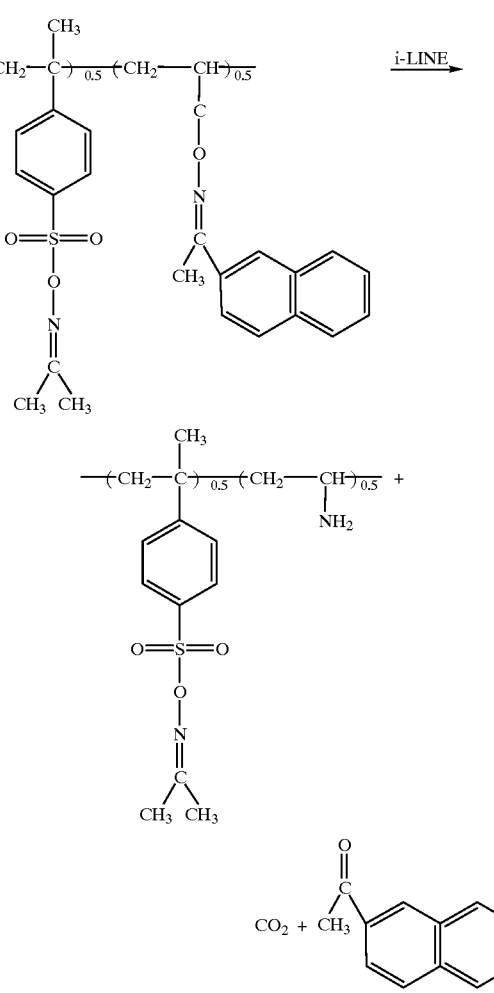

Figure 3C:
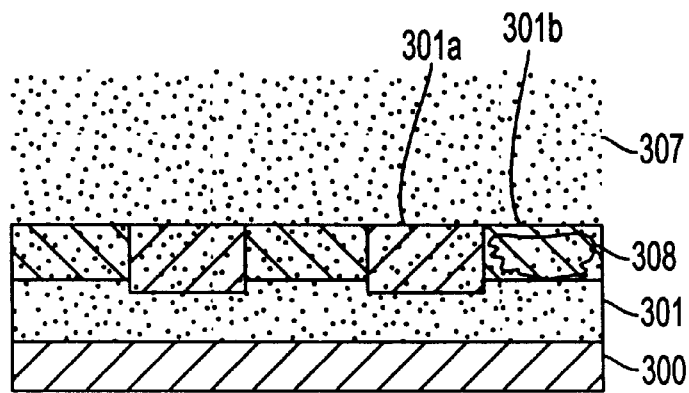

Then, as is shown in FIG. 3(c), the semiconductor substrate 300 is allowed to stand in air with a relative humidity of 95% at a temperature of 30° C. for 30 minutes, thereby supplying water vapor 307 onto the surface of the resist film 301. In this manner, the water vapor 307 is adsorbed by the surface of the unexposed area 301b which can easily adsorb water, and the adsorbed water is diffused into a deep portion, for example, at a depth of 100 nm from the surface of the unexposed area 301b of the resist film 301. Since the exposed area 301a is neutralized, water cannot be easily adsorbed. Thus, a water adsorbing layer 308 is selectively formed in the unexposed area 301b.

Figure 4A:
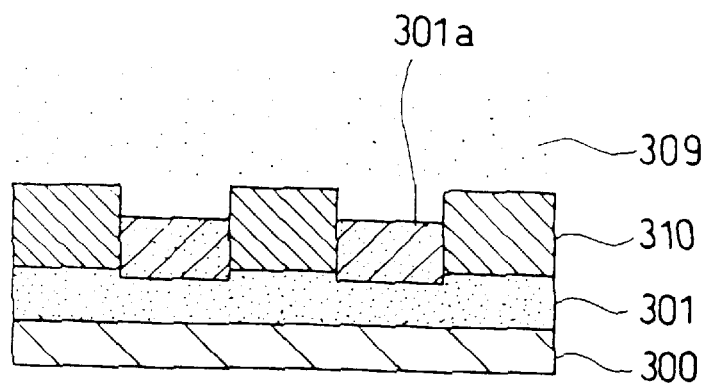
FIGS. 4(a) and 4(b) are sectional views for showing other procedures of the pattern forming method of the third embodiment.

Next, as is shown in FIG. 4(a), while retaining the semiconductor substrate 300 in the air with the relative humidity of 95% at a temperature of 30° C., vapor 309 of MTEOS, i.e., metal alkoxide, is sprayed onto the surface of the resist film 301 for 3 minutes, thereby selectively forming an oxide film 310 on the surface of the unexposed area 301b. In this case, the base, the amino group, works as a catalyst in the hydrolysis and dehydration of MTEOS, so that the oxide film 310 can be formed. Therefore, the oxide film 310 is formed merely in a portion where both the base working as the catalyst and water are present.

According to the third embodiment, in the exposed area 301a of the resist film 301, since amine is neutralized by generated sulfonic acid and loses its function as the catalyst and water cannot be easily adsorbed, the oxide film cannot be formed. On the other hand, in the unexposed area 301b of the resist film 301, since the base serving as the catalyst is present and a sufficient amount of water has been adsorbed, the oxide film 310 can be formed.

Figure 4B:
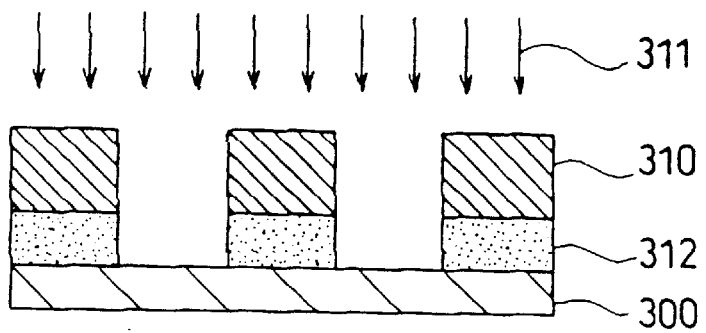
Figure 5A:
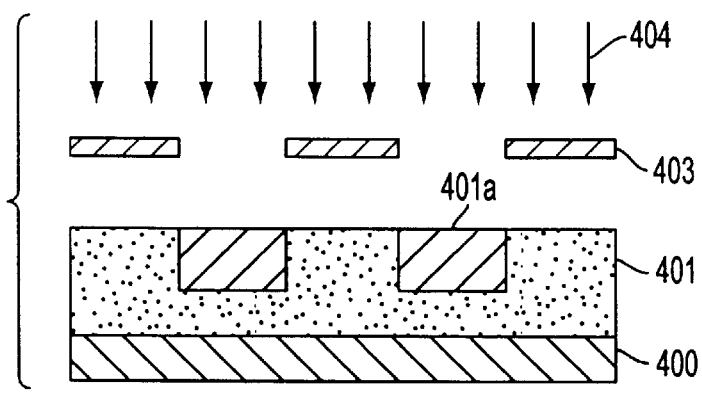
FIGS. 5(a) through 5(d) are sectional views for showing procedures of a conventional pattern forming method.
Figure 5B:
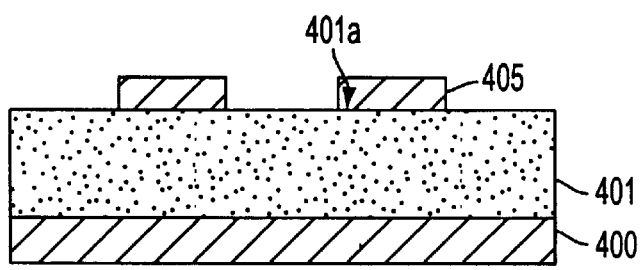
Figure 5C:
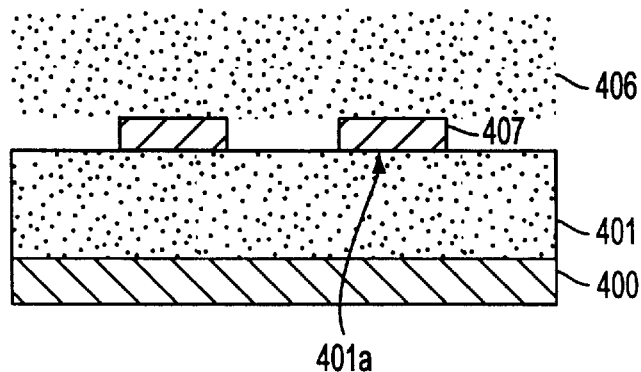
Figure 5D:
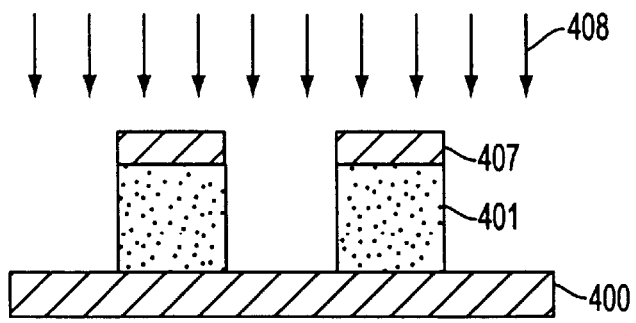

Then, as is shown in FIG. 4(b), by using the oxide film 310 as a mask, the RIE using $O_2$ plasma 311 is effected, thereby forming a resist pattern 312. The RIE using $O_2$ plasma is effected by using a parallel plate reactive ion etching system under conditions of a power of 900 W, a pressure of 0.7 Pa and a flow rate of 40 SCCM.

In this embodiment, since the oxide film 310 is selectively formed in the unexposed area 301b alone to be used in the etching, the positive type resist pattern 312 having a vertical section can be formed in the unexposed area 301b.

Furthermore, since the water vapor 307 is supplied to the resist film 301 in the procedure shown in FIG. 3(c), water is diffused into the deep portion from the surface of the unexposed area 301b of the resist film 301, so that the oxide film 310 can be grown toward the inside of the resist film 301. As a result, the oxide film 310 can attain a large thickness. In particular, since the base is generated merely on the surface of the resist film 301, the thickness of the water adsorbing layer 308 can be limited to a depth where the base is generated. As a result, water can be prevented from invading a portion below the exposed area 301a.

In addition, since MTEOS is supplied to the resist film 301 in the air with the relative humidity of 95% in the procedure shown in FIG. 4(a), equilibrium of water can be retained so that the water having been adsorbed by the resist film 301 can be prevented from evaporating and that water can be supplied in a sufficient amount for the formation of the oxide film 310. As a result, the resultant oxide film 310 can attain a thickness sufficiently large for withstanding the RIE using $O_2$ plasma.

After the supply of MTEOS, the resist film 301 can be allowed to stand in vacuum so as to evaporate alcohol included in the oxide film 310. Thus, the flow of the oxide film 310 can be avoided.

In this manner, according to the method of this embodiment, after generating a strong acid in the exposed area 301a through the pattern exposure using the first energy beam, a base is generated through the entire surface exposure using the second energy beam having a different energy band from the first energy beam. Thus, the exposed area 301a of the pattern exposure is neutralized, while the unexposed area 301b of the pattern exposure attains the basic property. Therefore, the oxide film 310 can be selectively formed in the unexposed area 301b of the pattern exposure, and the resist film 301 is etched by using the oxide film 310. As a result, it is possible to form the positive type fine-line resist pattern 312 having a satisfactory shape.

Also, since water is forcedly adsorbed in the unexposed area 301b before forming the oxide film 310, the resultant oxide film 310 can attain a large thickness required for the dry development by the RIE using $O_2$ plasma.

Furthermore, MTEOS is used as the metal alkoxide in this embodiment, but MTEOS can be replaced with any other metal alkoxide in a gas or liquid phase such as $Si(OCH_3)_4$ (tetramethoxysilane), $Si(OC_2H_5)_4$ (tetraethoxysilane), $Ti(OC_2H_5)_4$, $Ge(OC_2H_5)_4$, $Al(OC_2H_5)_3$, and $Zr(OC_2H_5)_3$.

Also, the dry development is effected by the RIE using $O_2$ plasma in this embodiment, but ECR (electron cyclotron resonance etching) using $O_2$ plasma is adoptable instead.

Furthermore, in the procedure for diffusing water in the surface of the unexposed area 301b of the resist film 301 in this embodiment, the semiconductor substrate 300 is allowed to stand in the water vapor, but water in a liquid phase can be supplied to the resist film 301 on the semiconductor substrate 300 instead. However, water can be more rapidly diffused and the thickness of the oxide film 310 can be more increased when the water is supplied in a gas phase than in a liquid phase, and hence, water is preferably supplied in a gas phase.

Alternatively, the effects to form a positive type fine-line resist pattern having a satisfactory shape of the third embodiment can also be attained as follows: A copolymer which can generate a base through irradiation with a first energy beam and an acid through irradiation with a second energy beam is used as a resist material. Through the irradiation with the first energy beam, a desired pattern is exposed so that the base is selectively generated in an exposed area. Then, through the irradiation of the entire surface with the second energy beam, the acid is generated on the entire surface of the resist film. Thus, the exposed area of the pattern exposure using the first energy beam is neutralized. Water vapor is then supplied to an unexposed area of the pattern exposure so that water can be adsorbed by the unexposed area. Then, both water vapor and alkoxysilane are supplied to the unexposed area, thereby forming an oxide film in the unexposed area. By using the oxide film, the resist film is etched, thereby forming a resist pattern.

In the first through third embodiments, the copolymers represented by Chemical Formulas 7, 10 and 12 are used as the resist materials. However, for example, a group for generating sulfonic acid represented by any of Chemical Formulas 16 through 21 can be used as the sulfonic acid generating group. Also, the sulfonic acid generating group can be appropriately replaced with a group having a strong acidic property.

Chemical Formula 16:

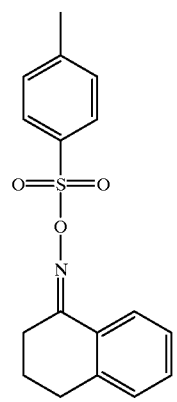

Chemical Formula 17:

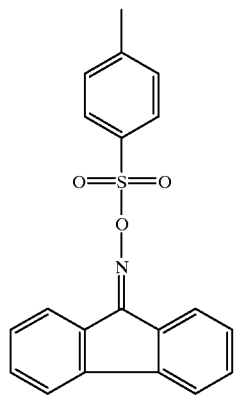

Chemical Formula 18:

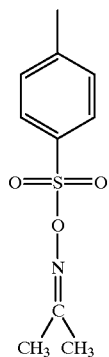

Chemical Formula 19:

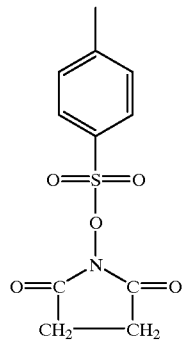

Chemical Formula 20:

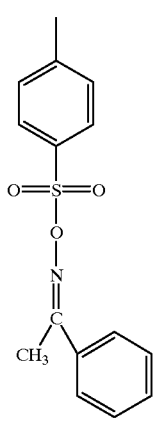

Chemical Formula 21:

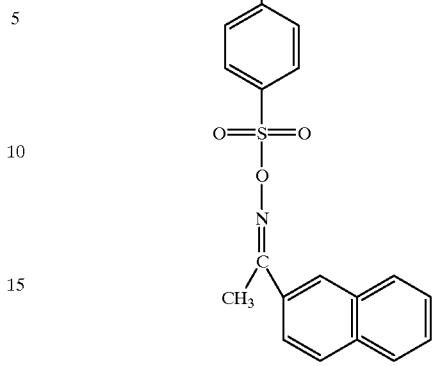

Furthermore, as the amine generating group, for example, a group for generating amine represented by any of Chemical Formulas 22 through 27 can be used, and the amine generating group can be appropriately replaced with a group having a basic property.

Chemical Formula 22:

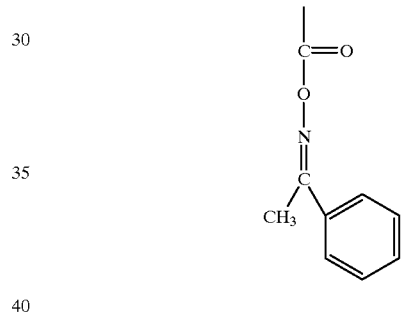

Chemical Formula 23:

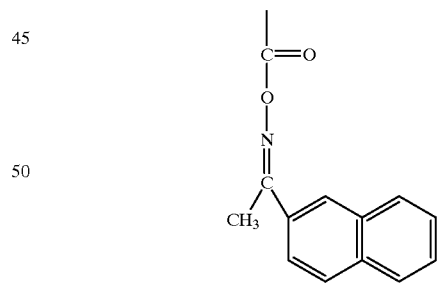

Chemical Formula 24:

Chemical Formula 25:

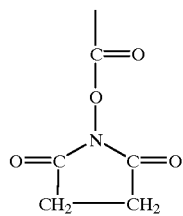

Chemical Formula 26:

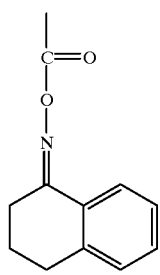

Chemical Formula 27:

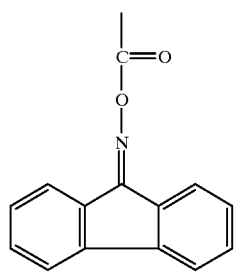

Moreover, the ArF excimer laser is used as a light source for the pattern exposure using the first energy beam, but the ArF excimer laser can be replaced with an i-line, a KrF excimer laser, EB, X-rays or the like. The i-line is used as a light source for the entire surface exposure using the second energy beam, but the i-line can be replaced with any other appropriate light source having a different energy band from that of the first energy beam. In this case, in accordance with the kinds of the first and second energy beams to be used, the sulfonic acid generating group or the group having an acidic property, and the amine generating group or the group having a basic property can be appropriately selected.

Furthermore, in the first through third embodiments, the copolymers including the sulfonic acid generating group or the amine generating group are used, but the copolymer can be replaced with another ternary or higher polymer obtained by further polymerizing any of the aforementioned binary polymers with a group represented by Chemical Formula 28 or 29.

Chemical Formula 28:

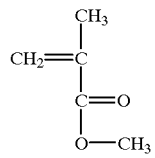

Chemical Formula 29:

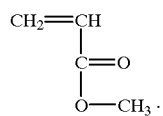

What is claimed is:

1. A pattern forming material comprising a copolymer including a first group for generating a base through irradiation with an energy beam and a second group having an acidic property;

wherein said copolymer is a binary copolymer represented by the following general formula or a ternary or higher copolymer obtained by further polymerizing said binary copolymer with another group:

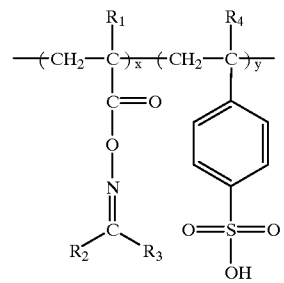

wherein $R_1$ indicates a hydrogen atom or an alkyl group; $R_2$ and $R_3$ independently indicate a hydrogen atom, an alkyl group, a phenyl group or an alkenyl group, or together indicate a cyclic alkyl group, a cyclic alkenyl group, a cyclic alkyl group having a phenyl group or a cyclic alkenyl group having a phenyl group; $R_4$ indicates a hydrogen atom or an alkyl group; x satisfies a relationship of $0<x<1$; and y satisfies a relationship of $0<y<1$.

* * * * *